(12) United States Patent
Lebo

(10) Patent No.: US 7,643,309 B1
(45) Date of Patent: Jan. 5, 2010

(54) RUGGEDIZED ELECTRONICS SUB-SYSTEM MODULE

(75) Inventor: Steve I. Lebo, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 1080 days.

(21) Appl. No.: 10/198,361

(22) Filed: Jul. 18, 2002

(51) Int. Cl.
*H05K 7/14* (2006.01)

(52) U.S. Cl. .................. 361/796; 361/752; 361/730; 361/797; 361/807; 174/520

(58) Field of Classification Search ......... 361/728–732, 361/809, 807, 796, 810, 800, 816, 818, 752, 361/788, 797, 724; 174/50, 520
See application file for complete search history.

(56) References Cited

U.S. PATENT DOCUMENTS

| | | | | |
|---|---|---|---|---|
| 4,771,365 A * | 9/1988 | Cichocki et al. | ............ | 361/705 |
| 4,882,655 A * | 11/1989 | Pavie | .......................... | 361/726 |
| 5,127,851 A * | 7/1992 | Hilbert et al. | ............... | 439/532 |
| 5,428,535 A * | 6/1995 | Katsumata et al. | ............ | 701/36 |
| 5,548,481 A * | 8/1996 | Salisbury et al. | ............ | 361/709 |
| 5,742,478 A * | 4/1998 | Wu | ............................. | 361/704 |
| 5,796,583 A * | 8/1998 | Gale et al. | .................. | 361/704 |
| 6,046,908 A * | 4/2000 | Feng | ........................... | 361/707 |
| 6,046,913 A * | 4/2000 | Helmstetter et al. | ......... | 361/796 |
| 6,166,919 A * | 12/2000 | Nicolici et al. | .............. | 361/800 |
| 6,377,453 B1 * | 4/2002 | Belady | ........................ | 361/687 |
| 6,411,514 B1 * | 6/2002 | Hussaini | ...................... | 361/704 |
| 6,449,164 B1 * | 9/2002 | Gershfeld | .................... | 361/752 |
| 6,544,052 B1 * | 4/2003 | Schwartz | ..................... | 439/152 |
| 6,574,117 B1 * | 6/2003 | Lebo | ........................... | 361/801 |
| 6,635,819 B2 * | 10/2003 | Awakura et al. | ............ | 174/350 |
| 6,665,189 B1 * | 12/2003 | Lebo | ........................... | 361/730 |
| 6,700,797 B2 * | 3/2004 | Frederick et al. | ............ | 361/797 |
| 6,711,022 B2 * | 3/2004 | Frederick et al. | ............ | 361/728 |
| 6,741,466 B1 * | 5/2004 | Lebo | ........................... | 361/687 |
| 6,747,866 B1 * | 6/2004 | Lebo et al. | ................... | 361/679 |
| 6,850,415 B2 * | 2/2005 | Dimarco | ...................... | 361/752 |
| 7,307,851 B2 * | 12/2007 | Dimarco | ...................... | 361/753 |
| 2002/0070043 A1 * | 6/2002 | Kitajima | ....................... | 174/50 |

OTHER PUBLICATIONS

U.S. Appl. No. 10/229,877, titled Software Radio System and Method, filed Aug. 28, 2002.
U.S. Appl. No. 10/229,941, titled Modular Communication Platform, filed Aug. 28, 2002.
Co-pending patent application entitled "Modular Electronics System Package" filed on an even date, inventor S. Lebo.
Co-pending patent application entitled "Modular Electronics System Chassis" filed on an even date, inventor S. Lebo.
Co-pending patent application entitled "Ruggedized Electronic Module Cooling System" filed on an even date, inventor S. Lebo and S. Sellner.
Co-pending patent application entitled "Electronic Module Restraint Apparatus" filed on an even date, inventor S. Lebo and S. Sellner.
Co-pending patent application entitled "Restraint Apparatus For An Electronics Module" filed on an even date, inventor S. Lebo.
"SINCGARS, Evolution to Revolution", ITT Industries (www.acd.itt.com).

* cited by examiner

*Primary Examiner*—Dameon E Levi
(74) *Attorney, Agent, or Firm*—Matthew J. Evans; Daniel M. Barbieri

(57) ABSTRACT

A ruggedized electronics sub-system module is disclosed. The ruggedized electronics sub-system module includes a ruggedized housing and an electronic sub-system environmentally sealed within the ruggedized housing. At least one electrical interface is configured to couple to an external electrical connector.

20 Claims, 9 Drawing Sheets

RUGGEDIZED ELECTRONICS SUB-SYSTEM MODULE

REFERENCE TO RELATED PATENT APPLICATIONS

This application relates to the following group of applications filed on the same day herewith. Each application in the group relates and incorporates by reference, each other application in the group. The invention of each application is assigned to the assignee of this invention. The group of applications includes the following:

U.S. patent application Ser. No. 10/198,520, issued as U.S. Pat. No. 6,665,189 on Dec. 16, 2003, entitled "MODULAR ELECTRONICS SYSTEM PACKAGE", and having inventor Steve I. Lebo;

U.S. patent application Ser. No. 10/198,493, issued as U.S. Pat. No. 6,741,466 on May 25, 2004, entitled "MODULAR ELECTRONICS SYSTEM CHASSIS", and having inventor Steve I. Lebo;

U.S. patent application Ser. No. 10/197,737 issued as U.S. Pat. No. 6,975,511 on Dec. 13, 2005, entitled "RUGGEDIZED ELECTRONIC MODULE COOLING SYSTEM", and having inventors Steve I. Lebo and Scott J. Sellner;

U.S. patent application Ser. No. 10/198,473, issued as U.S. Pat. No. 6,747,866 on Jun. 8, 2004, entitled "ELECTRONIC MODULE RESTRAINT APPARATUS", and having inventors Steve I. Lebo and Scott J. Sellner; and U.S. patent application Ser. No. 10/198,522, issued as U.S. Pat. No. 6,574,117 on Jun. 3, 2003, entitled "RESTRAINT APPARATUS FOR AN ELECTRONICS MODULE", and having inventor Steve I. Lebo.

BACKGROUND

The subject matter disclosed relates to ruggedized modular electronics systems. Further, the subject matter disclosed relates to ruggedized electronics modules of electronic sub-systems that fit into a chassis. More particularly, the subject matter disclosed relates to ruggedized electronics modules for use in a reconfigurable modular electronics package.

Many electronics systems exist for providing radio communications to and from vehicles. Such conventional electronics systems may be ruggedized for use in situations that are exposed to harsh environmental conditions such as dirty conditions, vibrational conditions, etc.

Although ruggedized electronics systems have been developed, these systems do not conventionally include options for reconfiguration of the systems via an exchange of modular components. Conventionally, ruggedized systems use a line replaceable unit (LRU), which is a sealed box containing a plurality of shop replaceable units (SRUs), which are typically electronics cards that may be inserted into the LRU when the sealed LRU is opened.

Conventionally, SINCGARS VHF frequency hopping radios have been used in military and rugged applications. SINCGARS radios are conventionally a single package system in which electronic components are fit into a ruggedized chassis. SINCGARS, however, have the disadvantage of not being easily reconfigurable with a plurality of ruggedized modular components, each having their own ruggedized package. Further, conventional systems do not utilize electronic sub-system modules that are individually sealed and ruggedized.

Accordingly, there is a need for a mechanical packaging system solution for electronics that use a minimum number of electronic sub-systems in a ruggedized chassis each module being individually sealed and ruggedized. There is also a need for an electronic module sub-system that performs in rugged environments including but not limited to military environments and may be fully immersed. Further still, there is a need for an electronic module sub-system that performs in both ground and airborne applications. Yet further still, there is a need for an electronics module sub-system that may be reconfigured to provide a plurality of platform and waveform configurations. Still further, there is a need for an electronic module sub-system for electronics that is flexible and scaleable and allows for multiple end configurations be assembled with a minimum subset of electronic sub-system types. And further still, there is a need for an electronic module sub-system that allows for heat removal associated with the electronic sub-systems.

It would be desirable to provide a system and/or method that provides one or more of these or other advantageous features. Other features and advantages will be made apparent from the present specification. The teachings disclosed extend to those embodiments which fall within the scope of the appended claims, regardless of whether they accomplish one or more of the aforementioned needs.

SUMMARY

One example of the invention relates to a ruggedized electronics sub-system module. The ruggedized electronics, sub-system module includes a ruggedized housing and an electronic sub-system environmentally sealed within the ruggedized housing. At least one electrical interface is configured to couple to an external electrical connector.

Another example of the invention relates to a ruggedized electronics sub-system module. The ruggedized electronics sub-system module includes a ruggedized housing including an environmentally sealed access plate and an electronic sub-system card contained within the housing. At least one electrical interface is disposed on the outer surface of the housing and is configured to provide an electrical connection from the electronic sub-system card to an external electrical connection.

Yet another example of the invention relates to a ruggedized electronics module. The ruggedized electronics module includes an electronic sub-system card and a means for protecting the sub-system card from environmental conditions. A means for electrically connecting the sub-system card to an external device is also included.

Alternative examples of the invention relate to other features and combination of features as may be generally recited in the claims.

BRIEF DESCRIPTION OF THE DRAWINGS

The invention will become more fully understood from the following detailed description, taken in conjunction with the accompanying drawings, wherein like reference numerals refer to like elements, in which.

DETAILED DESCRIPTION OF EXEMPLARY EMBODIMENTS

Figure 1:
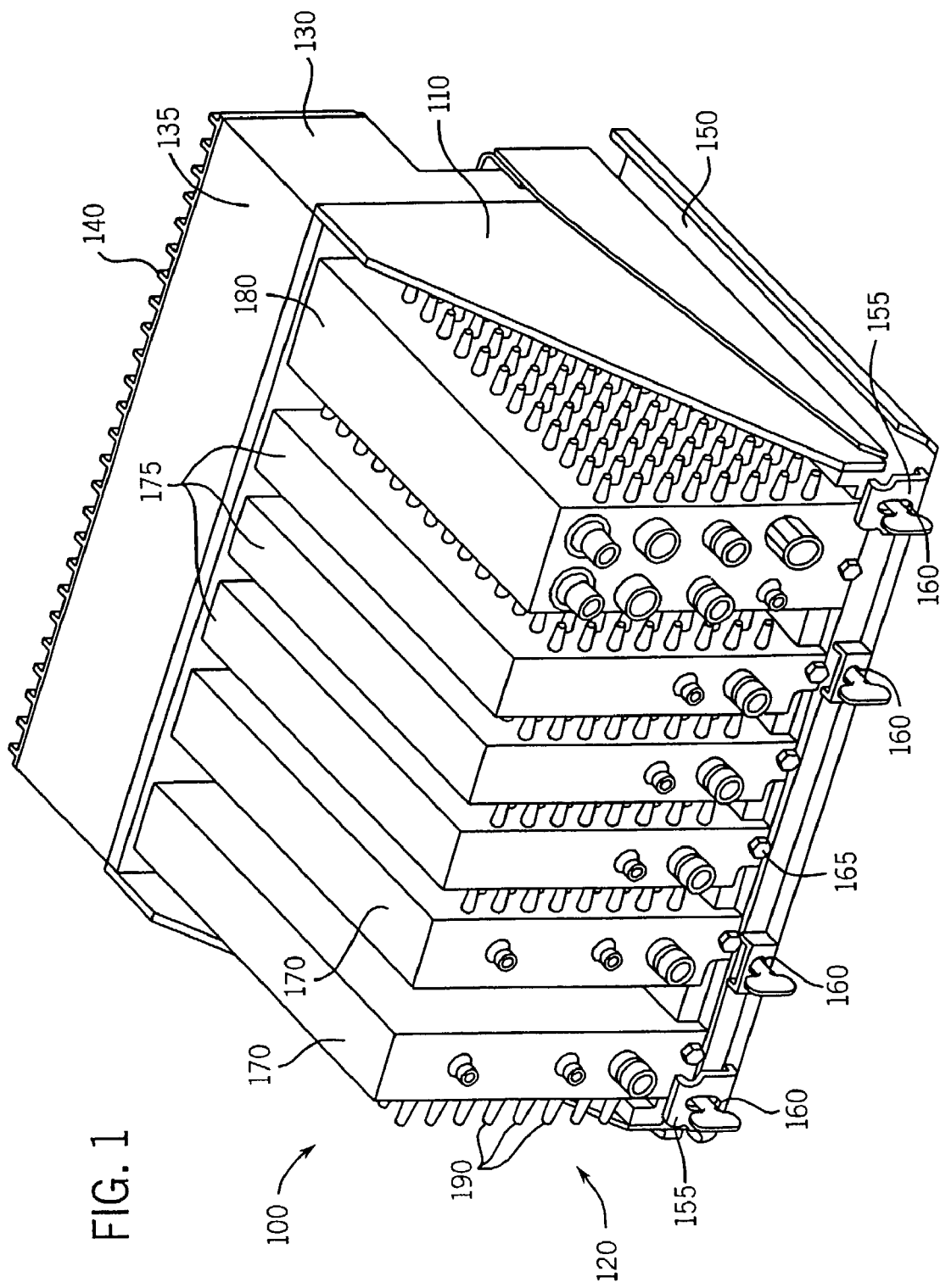
FIG. 1 is an exemplary perspective view of a modular electronic systems package supported on a chassis and having electronic modules installed thereon.

Referring to FIG. 1, an exemplary embodiment of an electronics system, for example, a modular electronic radio system 100, is depicted. Modular radio system 100 includes a chassis 110 (platform adapter or vehicular adapter) which supports a plurality of modular electronic components 120. Chassis 110 includes, in an exemplary embodiment, a power source 130 having a plurality of cooling fins 140 extending from a power source housing 135. Power source 130 provides power to the plurality of electronic modules 120.

In an exemplary embodiment, chassis 110 may be coupled to a mount 150 that provides for attachment to a vehicle, or other surface, and may be configured with damping devices to provide for vibration suppression and damping of vibrations which may be imparted from the mounting surface, such as a vehicle, to electronic modules 120. In the exemplary embodiment depicted, chassis 110 may be coupled to mount 150 via any of a plurality of means including, but not limited to, clamps 155 and further secured by screws and/or other fasteners through apertures 160 for securing mount 150 and chassis 110. In an exemplary embodiment, chassis 110 may be formed of any of a variety of materials, including, but not limited to, aluminum. Chassis 150 may alternatively be formed of other adequately rigid materials, such as, but not limited to, metals, metal alloys, polymers, ceramics, and composite materials.

In the exemplary embodiment depicted in FIG. 1, a plurality of electronic components 120 are coupled to chassis 110. Electronic modules 120 include, but are not limited to, power amplifiers 170, transceivers 175, and a Platform Interface Module (PIM) 180. Each of modular electronic components 120 is provided in a ruggedized housing formed of aluminum, or other adequately rigid materials and is sealed such that the casing or housing is impermeable by water and/or other liquids. Further, the housings of electronic modules 120 are configured such that they are resistant to chemical attack and/or penetration as well as resistant to dirt and vibrations. Further still, each of electronic modules 120 includes a plurality of cooling pins 190 formed on at least one and typically two outer surfaces of electronic modules 120 to provide for disposal of thermal energy created by electronic components inside each electronics module. Such pins 190 may be configured in such a manner that they are not easily broken off from the exterior surface of the electronic modules, i.e. the cooling pins have ruggedized characteristics due to their size and geometry, and further, in a preferred embodiment pins 190 allow for cooling through natural convective currents, i.e. using cooling pins 190, active cooling modules, e.g. a fan module, may not be required to maintain electronic modules 120 at or below a desired operating temperature.

System 100 is a flexible and adaptable electronic packaging system that allows for various combinations of ruggedized electronic modules 120. System 100 includes a ruggedized modular electronic platform adaptor or chassis 110 and a plurality of ruggedized electronic modules 120. In an exemplary embodiment, a single module mounting position and chassis may not have to be dedicated to a single modular function, but rather may be configured such that it may be equipped with different module functions as required. Further, in an exemplary embodiment, system 100 may be configured to meet environmental conditions, for example, those required for military applications, including immersion. In an exemplary embodiment, modules 120 perform radio system functions; however, the concepts disclosed are not limited to radio systems alone, but may be applied to any of a variety of electronics systems. In an exemplary embodiment, electronic modules 120 may be configured to provide 2-channel to 4-channel communications.

With regard to system 100, varying types of electronic modules 120 may be installed in different combinations on chassis 110 to create various end-item configurations. For example, as depicted in FIG. 1, chassis 100 includes two power amplifiers 170, three transceivers 175, and a PIM 180. However, chassis 110 may be configured with more or less modular component sites and, further, may include any of a variety of electronic modules.

Figure 4:
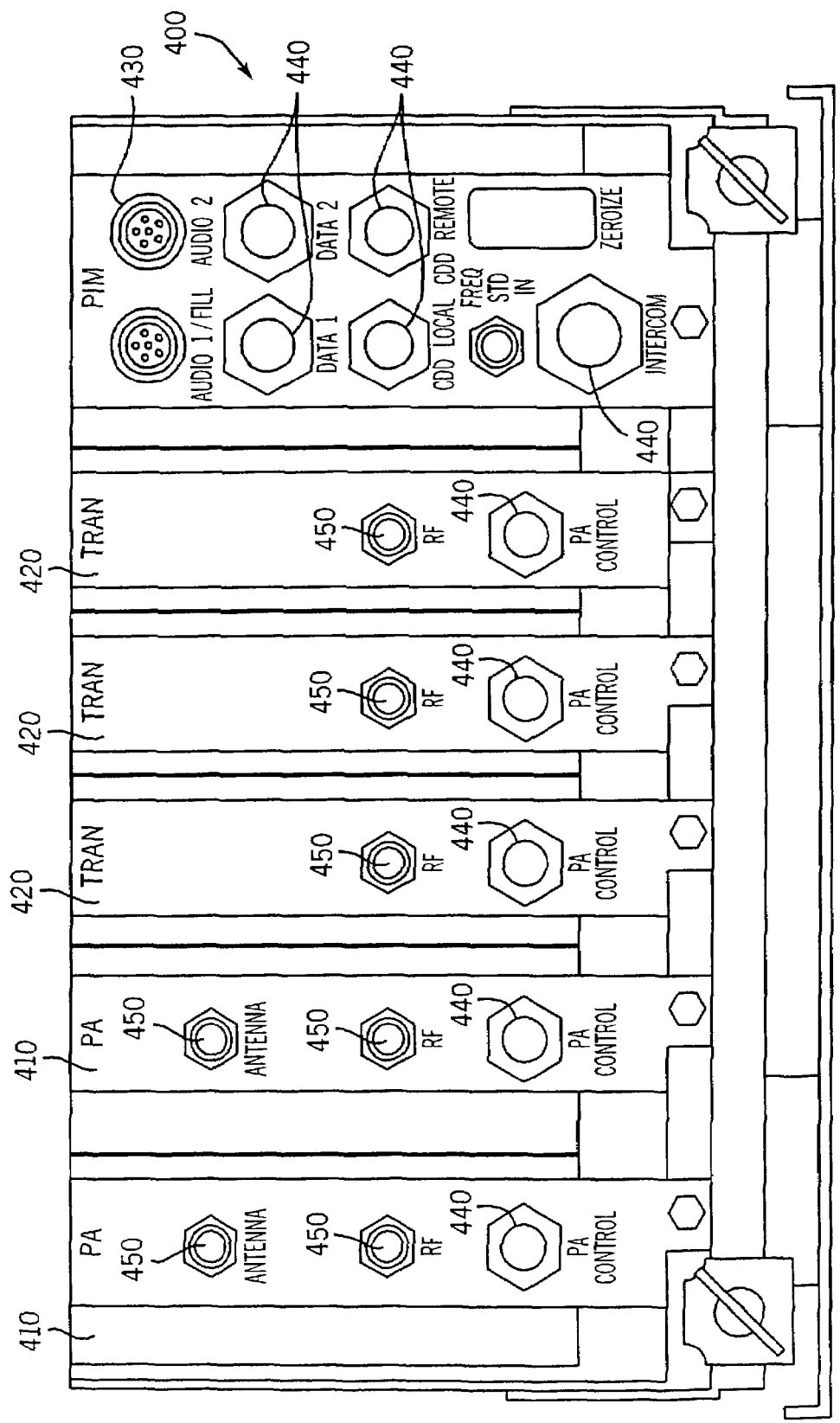
FIG. 4 is an exemplary front elevation view of a modular electronics system including two power amplifiers, three transceivers, and a PIM.

Referring now to FIG. 4, a front elevation view of a system 400 is depicted. System 400 includes two power amplifiers 410, three transceivers 420, and a PIM 430. Electronic modules 410, 420, and 430 are ruggedized modules having ruggedized housings and are sealed to prevent infiltration of water, dirt, and the like. In a particular exemplary embodiment, modules 410, 420, and 430 may be approximately 7.0 to 7.5 inches high and vary in width from 1.35 to 2.6 inches. However, individual modules 410, 420, and 430, are not limited to the dimensions recited; the dimensions recited are merely exemplary of a particular embodiment. Each of modules 410, 420, and 430 may include, for example, on the front face, control knobs, buttons, or any other input devices. Rear face 1220 may, for example, include input devices and/or connectors. Further, modules 410, 420, and 430 may include input connectors, such as pinned connectors 440 and the like, coaxial connectors 450 and the like, and/or other types of electrical connectors.

Figure 5:
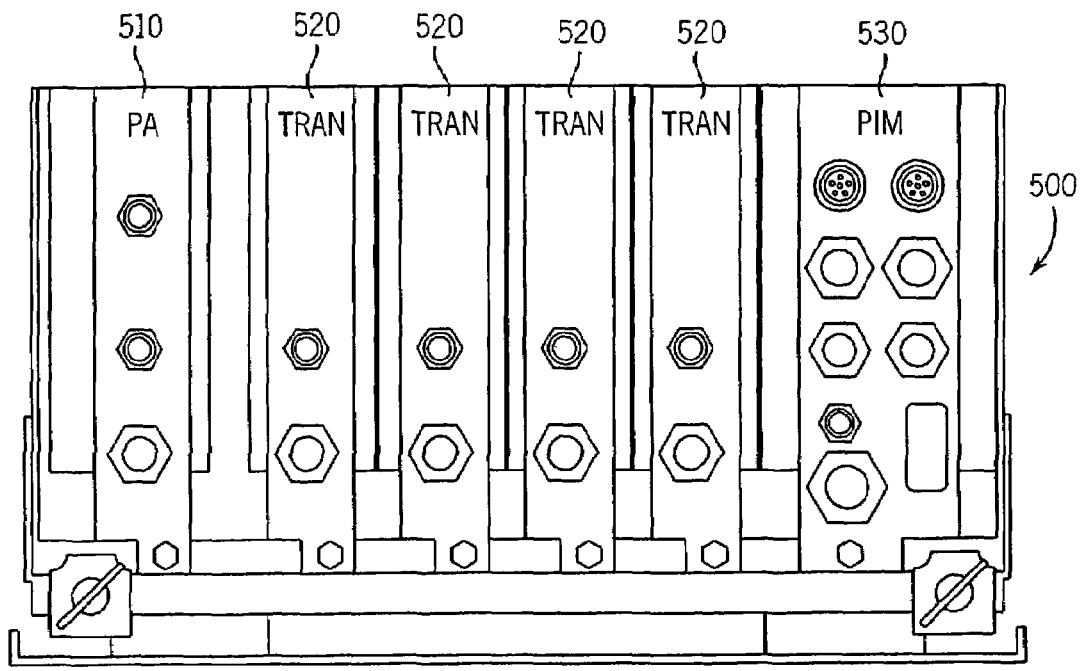
FIG. 5 is an exemplary front elevation view of an alternative configuration of electronic modules including a single power amplifier, four transceivers, and a PIM.

Referring now to FIG. 5, a system 500 is depicted forming an alternative electronics system configuration. System 500 includes a single power amplifier 510, four transceivers 520, and a PIM 530.

Figure 6:
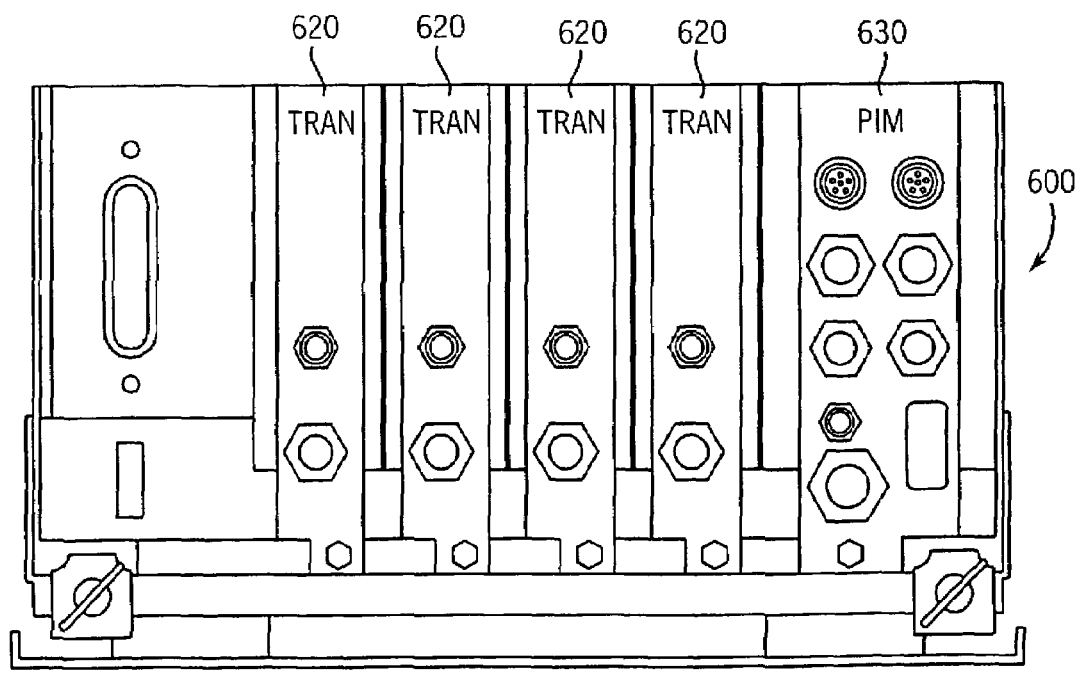
FIG. 6 is another exemplary front elevation view of an alternative configuration of electronic modules including four transceivers and a PIM.

Similarly, referring now to FIG. 6, a system 600 is formed by another alternative configuration of electronic modules, including four transceivers 620 and a PIM 630.

Figure 7:
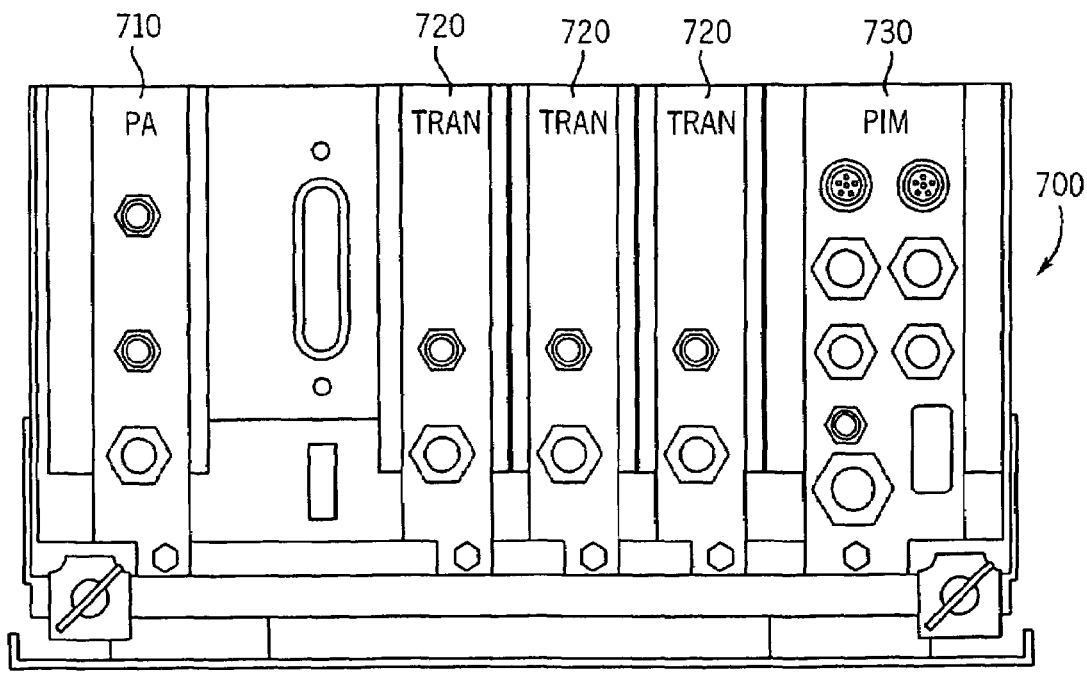
FIG. 7 is yet another exemplary front elevation view of an alternative configuration of electronic modules including a single power amplifier, three transceivers, and a PIM.

Referring now to FIG. 7, a system 700 is depicted. System 700 is an alternative configuration of electronic modules, including a single power amplifier 710, three transceivers 720, and a PIM 730.

Figure 8:
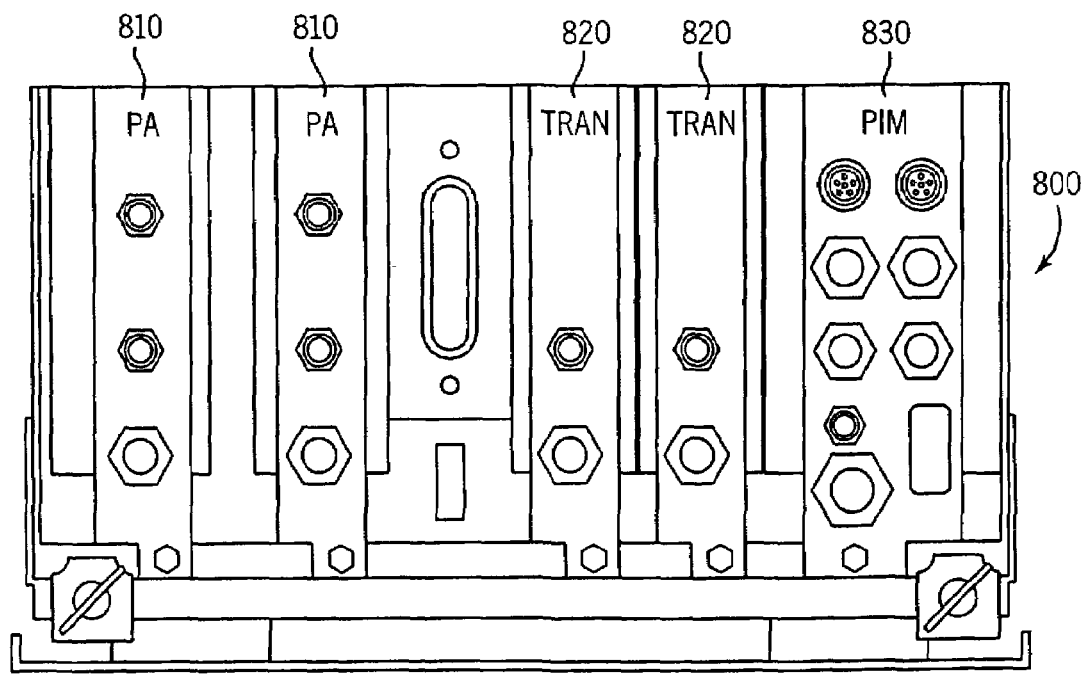
FIG. 8 is still yet another exemplary front elevation view of an alternative configuration of electronic modules including two power amplifiers, two transceivers, and a PIM.

Referring now to FIG. 8, a system 800 is depicted. System 800 is yet another exemplary embodiment of an alternative configuration of electronic modules, including two power amplifiers 810, two transceivers 820, and a PIM 830.

Figure 9:
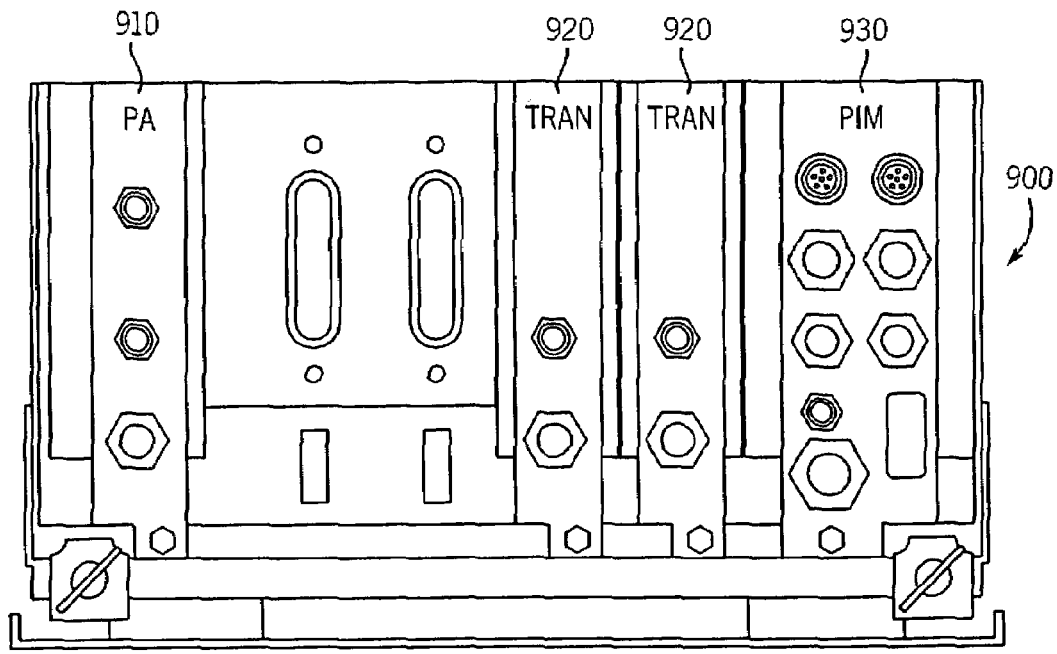
FIG. 9 is yet still another exemplary front elevation view of an alternative configuration of electronic modules including a single power amplifier, two transceivers, and a PIM.

Referring now to FIG. 9, a system 900 is depicted. System 900 includes a power amplifier 910, two transceivers 920, and a PIM 930. Thus, it is abundantly clear that the ruggedized electronics systems depicted may be configured in any of a variety of manners and may further be reconfigured using a different combination of electronic modules. Further, it should be noted that each of the electronic modules is individually ruggedized, having a ruggedized housing and including ruggedized components and further being sealed from infiltration by water and other contaminants. The systems described above form radio systems, however, the modular ruggedized electronics systems may be used to form other types of electronics systems.

Figure 2:
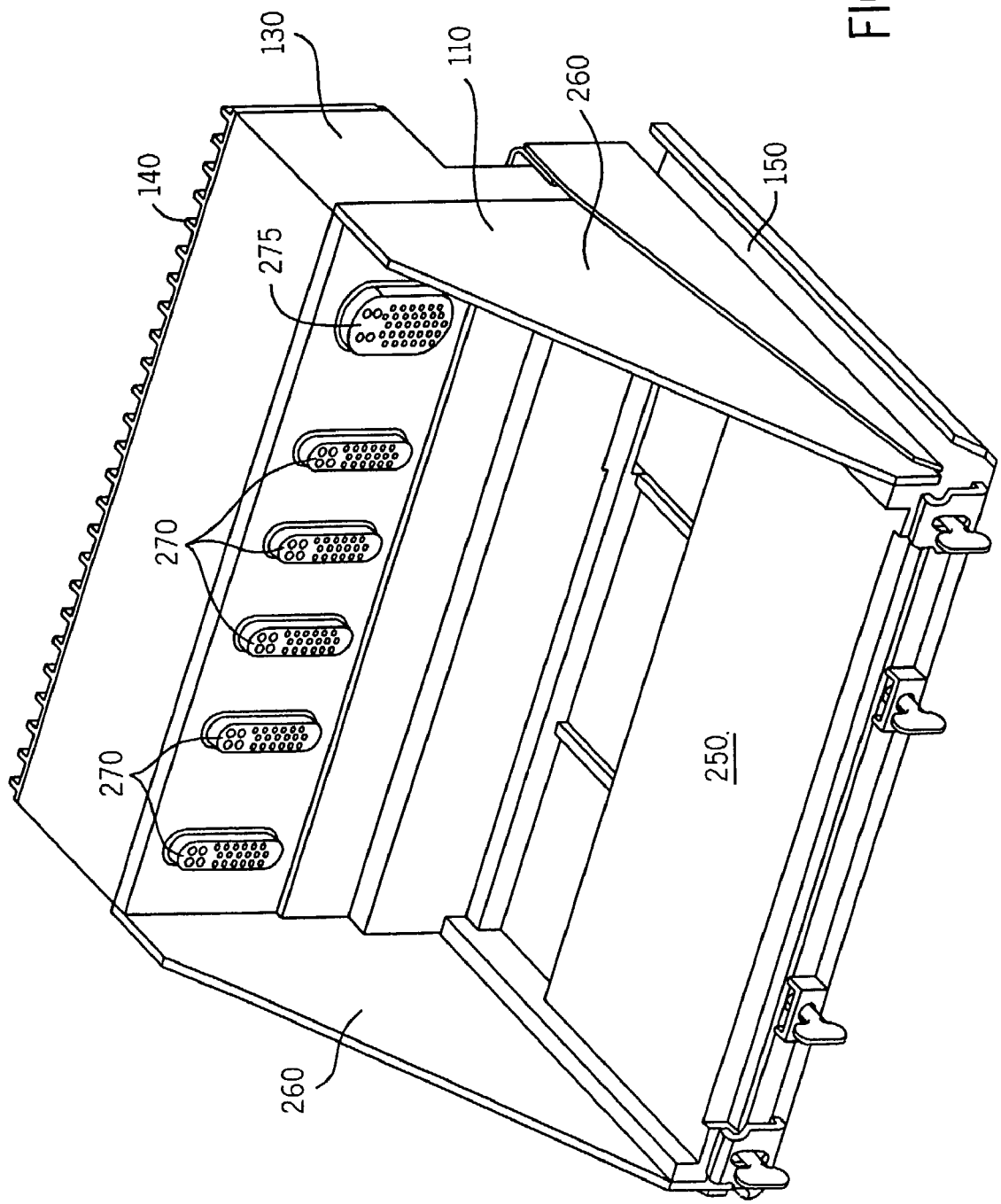
FIG. 2 is an exemplary depiction of the chassis and mount of FIG. 1.
Figure 3:
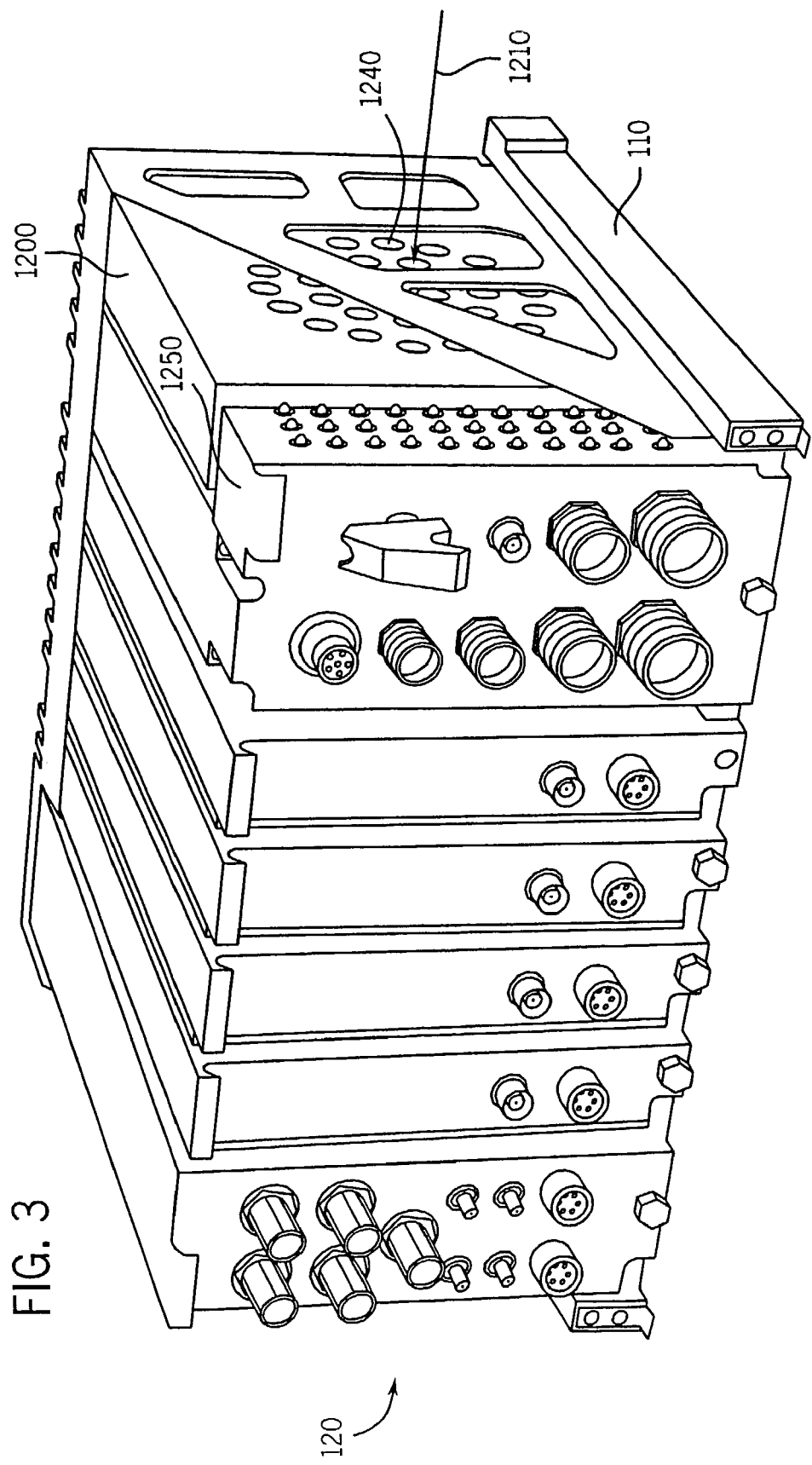
FIG. 3 is an exemplary depiction of a modular electronics system including an active air movement module.

Referring now to FIG. 2, chassis 110 is depicted. Chassis 110 includes a power supply 130 having a plurality of fins 140 for disposing of thermal energy from chassis 110 and generated by power source 130. Chassis 110 also includes a platform 250 for supporting electronic modules 120. Chassis 110 may also include side portions 260 which may partially encase the entire electronics package and also may provide rigidity and strength to chassis 110. Side portions 260 may be a solid panel as depicted, or further may be a panel including a plurality of apertures and/or openings as depicted in FIGS. 3 and 10-12. Chassis 110 may be an open frame chassis that is designed or configured for installation on existing end platform mounts, for example, an MT-6352 mount 150 depicted in FIGS. 1 and 2.

Further, chassis 110 includes a plurality of connectors and/or interfaces 270 and 275 that are used to interface a variety of electronic modules. In an exemplary embodiment, five of the connectors 270 are identical with one connector 275 being different to support a PIM. However, any of a variety of connector configurations may be used depending on the end use. Chassis 110 is preferably formed of a cast aluminum material, but may be formed of any of a variety of rigid materials, including, but not limited to, other metal and metal alloys, polymers, ceramics, composite materials, and the like. When electronic modules are installed, signaling between each of the electronic modules is distributed in the modular electronics platform adapter 110. In a particular embodiment, each of the electronic subsystem module positions in chassis 110 includes a signal interface and connector 270, which are interconnected for communicating with each other. The rugged electronic subsystem modules may share a common universal signaling interface and connector type. A unique modular position having a unique modular connector 275 may be used to act as a hub for signals from all of the common module positions.

Because of the modularity of system 100, rugged modular electronics platform adapter 110 allows for a large potential number of end user configurations which may be tailored to the specific end user requirements. Further, because of the modularity of system 100, there are lower life cycle costs, and less costs of maintaining such systems is enabled because fewer total package assembly types need to be stocked.

In a particular exemplary embodiment, multiple modular electronics platform adapters (chassis 110) may be used together in a single installation on a vehicle or other installation site, rather than producing a single new chassis and new modules when larger systems are required. Further, the modularity of system 100 provides for the ability for an existing electronic subsystem module to be replaced with a newer technology or upgraded technology version. Further still, an advantage to using the modular electronics platform adapter 110 with electronic modules 120 is that when a single module fails, the module may be simply interchanged without having to remove the entire system 100 from the vehicle and sent out for repair. Also, some of the functionality of system 100 may be maintained even while certain modules are being repaired.

Because of the open and modular design of system 100, either passive natural convection cooling or active forced air cooling techniques may be utilized with the same set of electronic modules 120. Also, having a modular electronics mounting system approach provides benefits over a single monolithic one box approach in the area of channel-to-channel isolation. Because multiple radios may be used in a single housing, there may be significant channel-to-channel interference concerns with conventional systems. Utilizing a modular approach solves the isolation problem by isolating each radio module from each other and utilizing only a digital interface to the other radio system components (excluding power amplifiers, etc.). Although the disclosed system 100 may be utilized in military applications on military vehicles, the concepts disclosed and designs disclosed may be applied to other areas that include commercial products.

Figure 10:
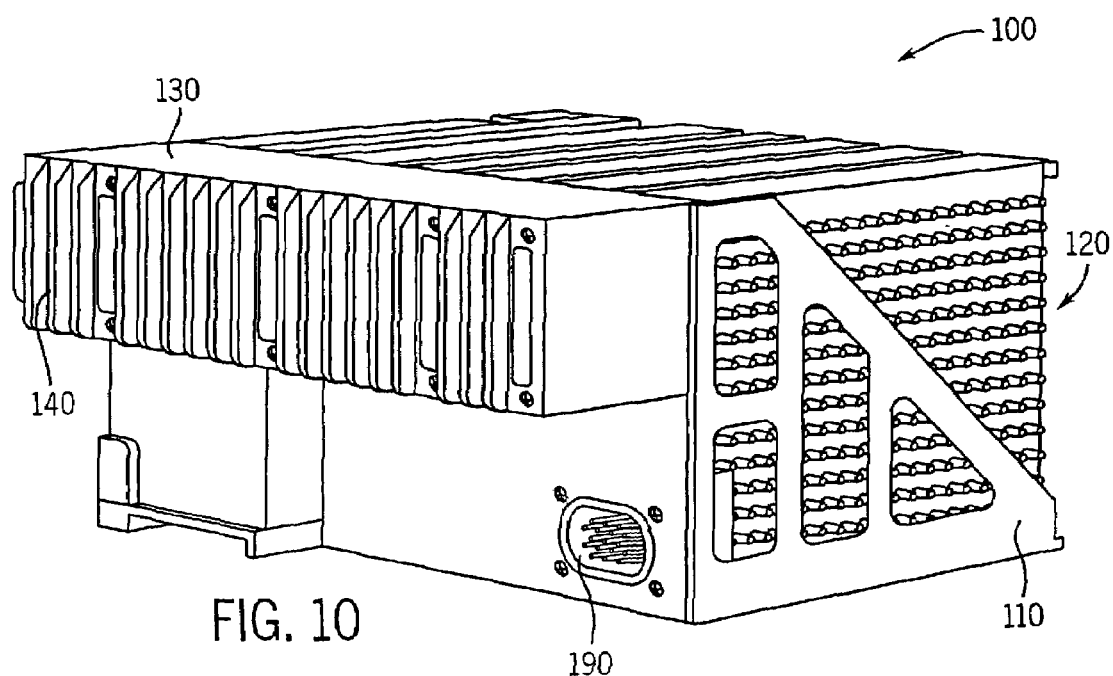
FIG. 10 is an exemplary rear perspective view of a modular electronic system package supported by a chassis.

Referring now to FIG. 10, a rear view of system 100 is depicted including chassis 110, power supply 130, with rear fins 140. Further, the rear electronic connector 190 is depicted. Connector 190 is configured to connect to a mating connector on the vehicle. Connector 190 is in communication with module 180 and power supply 130.

Figure 11:
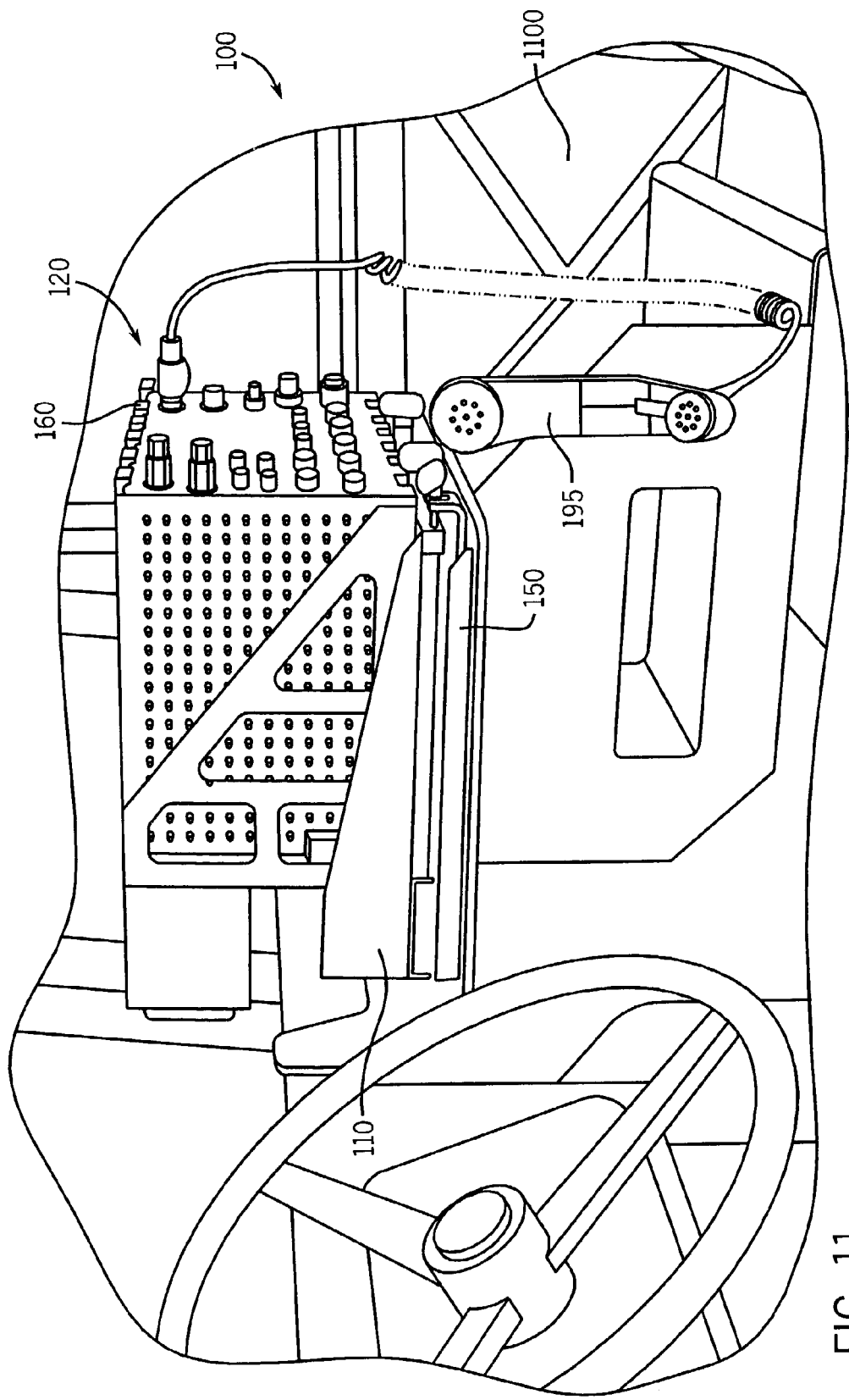
FIG. 11 is an exemplary perspective view of a modular electronic system installed in the cab of a vehicle.

Referring now to FIG. 11, system 100 is depicted in a vehicle 1100. System 100 is mounted on a mount 150 that is coupled to vehicle 1100. Chassis 110 is coupled to mount 150. Chassis 110 holds a plurality of ruggedized electronic modules 120. In the exemplary embodiment depicted, system 100 includes a hand set 195 for voice communications that is coupled to a PIM 160. In the exemplary embodiment depicted, vehicle 1100 is a Humvee. However, vehicle 1100 may be any of a variety of military or other vehicles including, but not limited to, tanks, jeeps, as well as airborne vehicles such as, but not limited to, helicopters, airplanes, and the like. In further alternative embodiments, system 100 may be mounted on the exterior of the vehicle, for example, the vehicle rear end, and therefore, be subjected to harsh environmental conditions such as, but not limited to, dirt, dust, water, chemicals, submersion in liquids, and the like.

Figure 12:
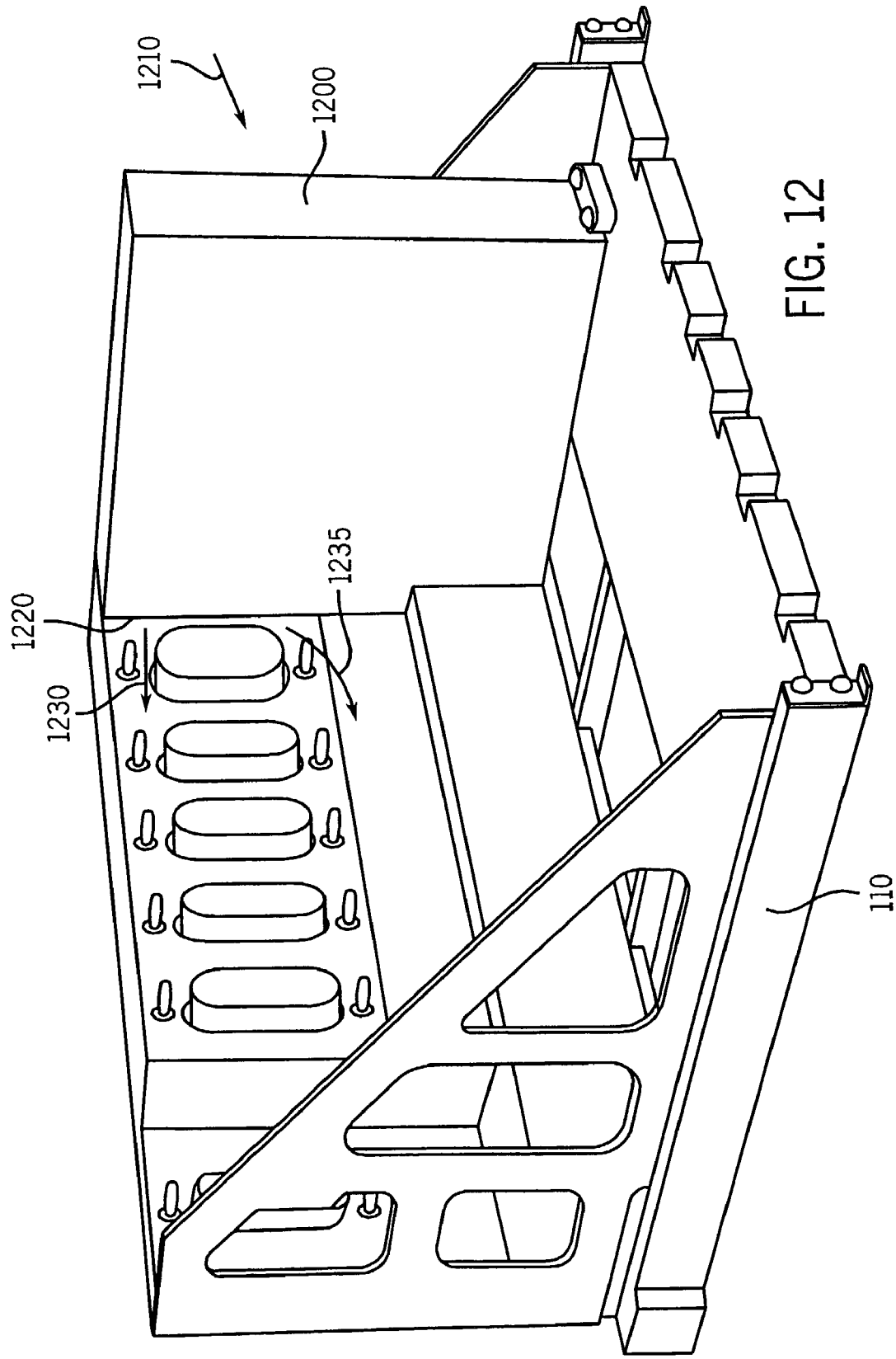
FIG. 12 is an exemplary embodiment of an electronic module chassis having an air mover module installed.

Referring now to FIG. 12, an exemplary embodiment of chassis 110 is depicted. Chassis 110 is depicted having an air mover module 1200 coupled thereto. In an exemplary embodiment, air mover module 1200 has a plurality of openings configured on the unseen side of module 1200 that are used to bring ambient air into module 1200 in direction 1210. The inclusion of an air mover module 1200 may be used particularly in airborne applications. Air entering in direction 1210 will exit via a slit on surface 1220 which is facing chassis 110 in direction 1230. Air from mover module 1200 moves air in direction 1230 and chassis 110 directs the air in direction 1235, as well as in many other directions. Air from air mover module 1200 will exit chassis 110 through apertures 1245 in directions 1250 and will be dispersed and blown past modules which may be installed on chassis 110. For example, referring now to FIGS. 3 and 10-12, chassis 110 is depicted having a plurality of modules 120 installed thereon and including an air mover module 1200 and showing apertures 1240 for receiving air in direction 1210 depicted in FIG. 12. Air mover module 1200 is configured to be nested in a PIM 1250 which is formed to surround air mover module 1200 within chassis 110.

While the detailed drawings, specific examples and particular formulations given describe preferred and exemplary embodiments, they serve the purpose of illustration only. The inventions disclosed are not limited to the specific forms shown. The hardware configurations shown and described may differ depending on the chosen performance characteristics and physical characteristics of the electronic devices. For example, the type of electronic device, electronic system, or materials and structures used may differ. The systems and methods depicted and described are not limited to the precise details and conditions disclosed. Furthermore, other substitutions, modifications, changes, and omissions may be made in the design, operating conditions, and arrangement of the exemplary embodiments without departing from the scope of the invention as expressed in the appended claims.

What is claimed is:

1. A ruggedized electronics sub-system module for use with an air mover module for attachment to a chassis, the ruggedized electronics sub-system module comprising:
    a ruggedized housing including a first surface opposite a second surface, the ruggedized housing being shaped to nest around at least two surfaces of the air mover module without enclosing the air mover module;
    an electronic sub-system environmentally sealed within the ruggedized housing that functions as only one of a platform interface module, power amplifier, a transceiver, and a network interface unit; and
    a first electrical interface coupled to the electronic sub-system and located on a first surface of the ruggedized housing and a second electrical interface coupled to the electronic sub-system and located on the second surface of the ruggedized housing opposing the first surface;
    wherein the ruggedized electronics sub-system module is coupleable to the chassis having at least one other electronics sub-system module, and is removeable from the chassis independently from the at least one other electronics sub-system module.

2. The ruggedized electronics sub-system module of claim 1, further comprising:
    a support portion of the housing configured to couple the housing to an external support structure.

3. The ruggedized electronics sub-system module of claim 1, wherein the housing includes aluminum.

4. The ruggedized electronics sub-system module of claim 1, wherein the housing is formed by a die-cast process.

5. The ruggedized electronics sub-system module of claim 1, wherein the housing includes a removable panel and a seal for sealing the panel to the housing.

6. The ruggedized electronics sub-system module of claim 1, wherein the electronic sub-system includes a power amplifier.

7. The ruggedized electronics sub-system module of claim 1, wherein the electronic sub-system includes a transceiver.

8. The ruggedized electronics sub-system module of claim 1, wherein the electronics sub-system includes network interface unit.

9. A ruggedized electronics sub-system module for use with an air mover module for attachment to a chassis, the ruggedized electronics sub-system module comprising:
    a ruggedized housing including a first surface opposite a second surface, the ruggedized housing being configured to nest around at least two surfaces of the air mover module;
    an electronic sub-system card contained within the housing, the electronic sub-system card functioning as only one of a platform interface module, power amplifier, a transceiver, and a network interface unit; and
    an electrical interface disposed on the first outer surface of the housing and configured to provide an electrical connection from the electronic sub-system card to an external electrical connection, and a second electrical interface coupled to the electronic sub-system card and disposed on the second surface of the housing generally opposing the first outer surface;
    wherein the ruggedized electronics sub-system module is coupleable to the chassis having at least one other electronics sub-system module, and is removeable from the chassis independently from the at least one other electronics sub-system module.

10. The ruggedized electronics sub-system module of claim 9, wherein the
    first surface covers the air mover module at a front of the chassis.

11. The ruggedized electronics sub-system module of claim 9, wherein the housing includes aluminum.

12. The ruggedized electronics sub-system module of claim 9, wherein the housing is formed by a die-cast process.

13. The ruggedized electronics sub-system module of claim 9, wherein the electronic sub-system includes a power amplifier.

14. The ruggedized electronics sub-system module of claim 9, wherein the electronic sub-system includes a transceiver.

15. The ruggedized electronics sub-system module of claim 10, wherein the electronics sub-system includes a network interface unit.

16. A ruggedized electronics module for use with an air mover module for connection to a chasis, comprising:
    an electronic sub-system card that functions as only one of a power amplifier, a transceiver, a platform interface module and a network interface unit;
    a means for protecting the sub-system card from environmental conditions, the means for protecting nesting with the air mover module; and
    a means for electrically connecting the sub-system card to an external device, the means for electrically connecting disposed on two separate surfaces of the means for protecting;
    wherein the ruggedized electronics module is coupleable to the chassis having at least one other electronics module, and is removeable from the chassis independently from the at least one other electronics module.

17. The ruggedized electronics module of claim 16, further comprising:
    heat dissipation structures formed on the means for protecting the sub-system card.

18. The ruggedized electronics module of claim 16, wherein means for protecting includes a means for mounting to an external support structure.

19. The ruggedized electronics module of claim 16, wherein the electronics sub-system card includes a radio sub-system.

20. The ruggedized electronics module of claim 16 wherein the means for protecting is L-shaped from a top view.

* * * * *